May 9, 1961 J. R. WILLIAMS 2,983,853

SEMICONDUCTOR ASSEMBLY STRUCTURES

Filed Oct. 1, 1958

INVENTOR
JOHN R. WILLIAMS
BY H. Vincent Harsha
ATTORNEY

United States Patent Office 2,983,853
Patented May 9, 1961

2,983,853

SEMICONDUCTOR ASSEMBLY STRUCTURES

John R. Williams, Natick, Mass., assignor to Raytheon Company, a corporation of Delaware Filed Oct. 1, 1958, Ser. No. 764,723
4 Claims. (Cl. 317—234)

Figure 1:
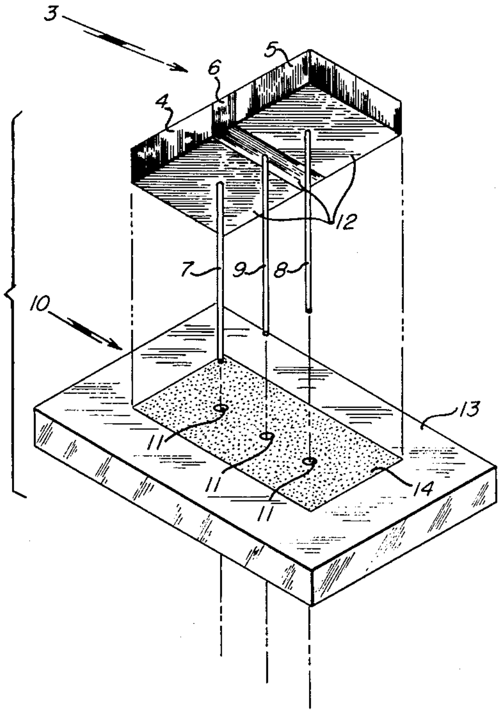

This invention relates generally to semiconductor devices and, more particularly, to an assembly structure for bar-type semiconductor devices that allows said devices to be easily processed and handled.

One particular type of junction semiconductor device is fabricated in the shape of a rectangular slab or bar usually having pre-formed impurity regions that give rise to one or more p-n junctions. These junctions are formed by well-known diffusion, growing, or melt-back techniques. Wides are fused to each of these impurity regions to allow the device to be connected to an external circuit. For example, in bar-type transistors, collector, emitter and base wires are fused to their respective regions of the transistor by conventional fusing techniques. In order to process and handle such bar-type semiconductor devices, the devices are usually mounted between posts or stems. During subsequent steps of the processing of said transistor, as, for instance, in an etching process for reducing the cross-sectional area of the bar, relatively heavy stems may be used in the semiconductor assembly structure. If the semiconductor devices are merely mounted between these posts, or stems, substantially the entire weight and strain to which the assembly may be subjected is borne by the bar itself. Since the bar is usually relatively fragile due to the very small cross sections used, slight impacts or vibrations may cause the assembly to break. In many cases, during the etching process the attached connecting wires are undesirably exposed to the etching solution and, thus, often limit the amount of etching that can be given to the units.

This invention, however, provides an assembly structure that furnishes mechanical stability and strength, even for bars of extremely small cross-sectional area. In this invention, a bar-type semiconductor device, such as a transistor, is mounted on a plate of material, such as a ceramic or glass, having a coefficient of thermal expansion substantially equal to that of the semiconductor device. The semiconductor device is bonded to the plate by an adhesive material, such as an adhesive resin. In this invention, the strains and weight are substantially borne by the plate rather than by the bar itself and, thus, the bar may be more easily handled and packaged. The wires that are attached to the semiconductor device may be caused to protrude through openings in the plate so that during the etching process the plate provides a suitable mask that prevents the etching solutions from coming into contact with the wires.

Figure 2:
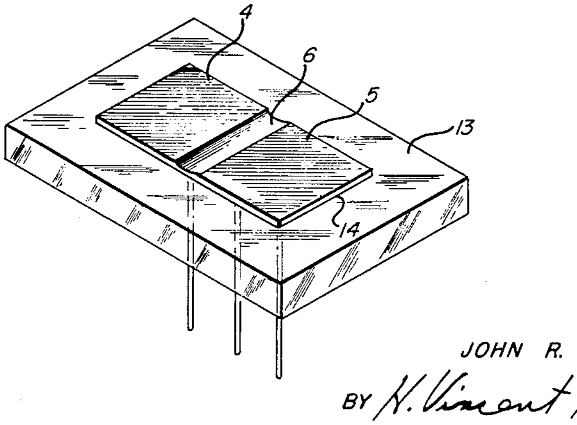

The invention may be more easily described with the help of the drawing in which:

Fig. 1 shows a pictorial, exploded view of an assembly structure consisting of a bar-type semiconductor device and mounting plate; and Fig. 2 shows the assembly structure of Fig. 1 after the semiconductor device has been exposed to an etching solution.

In Fig. 1 there is shown a conventional bar-type transistor 3 having three regions of impurity. For the sake of clarity, the dimensions of the transistor have been greatly exaggerated. Regions 4 and 5 may be regions containing a p-type impurity and region 6 may be a region having an n-type impurity. Thus, transistor 3 represents a well-known p-n-p junction transistor. Transistor 3 has three wires extending from and attached to surface 12 of said transistor. A wire 7 is fused to region 4, a wire 8 is fused to region 5, and a wire 9 is fused to region 6. In Fig. 1 there is also shown a mounting plate 10 having substantially cylindrical openings 11, which are spaced apart by distances substantially equal to the spacing between wires 7, 8, and 9. On surface 13 of plate 10, there is shown an adhesive material 14 for bonding surface 12 of transistor 3 to surface 13 of plate 10. As can be seen in Fig. 1, when the transistor is so bonded, wires 7, 8, and 9 extend through holes 11 and out the other side of plate 10. In this way, a mechanically stable unit is constructed. The unit can then be easily handled during subsequent processing or packaging.

For example, it is often desirable in subsequent processing to etch bar-type transistor 3 to reduce its thickness and, hence, reduce its cross-sectional area at the junction points between different regions of impurity. In the etching process, the unit may be held so that surface 13 of mounting plate 10, on which transistor 3 is mounted, may be held face down in an electrolytic or chemical etching solution. The bar may be made as thin as desired by controlling hte etching action. Because of differences in resistivity between the different regions along the bar, the etching will be preferential. In other words, for the transistor shown in Fig. 1, the n region 6 will have its material etched away at a faster rate than will the p regions 4 and 5. Thus, after the etching process, the finished unit will be substantially as shown in Fig. 2, wherein it can be seen that region 6 has been etched faster and, therefore, has a smaller average cross-sectional area than that of the other regions. Despite the reduced cross-sectional area, especially the very thin region 6, the structure retains its strength due to the mounting plate and the finished unit, after etching, can now be easily handled and packaged in a conventional manner.

The assembly structure of this invention provides a number of advantages when compared to structures used previously. Principally, the invention provides greater mechanical strength for the assembled unit. In addition, the connecting wires extending from different impurity regions of the transistor are masked from the etching solution by the plate 10. If the wires are made of material which may be harmed by the etching solution, the masking that is provided thereby prevents any harmful effects. The ease with which etching can be done permits the fabrication of bar-type transistors having extremely small cross-sectional areas. It has also been observed that such a construction produces lower collector capacitance and emitter capacitance as well as lower values of emitter cut-off current and collector cut-off current. Thus, a better frequency response is provided for the transistor.

The embodiment shown in the figures is not necessarily the only embodiment for this invention. Any method of bonding the semiconductor device to the mounting plate may be used. The assembly may be used for any type of device having a bar shape and having, also, an extremely small cross-sectional area. Because the coefficients of expansion of the semiconductor device and the plate are substantially equal, the semiconductor device is better protected against the extreme ranges of hot and cold temperature to which the device may be subjected. Hence, this invention is not to be construed as limited to the specific embodiment shown in the figures and described herein except as defined by the appended claims.

What is claimed is:

1. A semiconductor assembly comprising a semiconductor device having a plurality of wires attached to and extending from one surface of said device, said plurality of wires being spaced at predetermined distances from each other, a mounting plate of material having a coefficient of thermal expansion substantially equal to that of said semiconductor device, said mounting plate having a plurality of openings being spaced from each other at predetermined distances corresponding to said predetermined distances between said wires, and a silicone resin located between said device and said plate for bonding said one surface of said device to said plate whereby said wires extend through said openings.

2. A semiconductor assembly comprising a bar-type transistor having impurity regions of different cross-sectional area and having a plurality of wires attached to said regions and extending from one surface of said device, said plurality of wires being spaced at predetermined distances from each other, a mounting plate of material having a coefficient of thermal expansion substantially equal to that of said bar-type transistor, said mounting plate having a plurality of openings being spaced from each other at predetermined distances corresponding to said predetermined distances between said wires, and a silicone resin located between said device and said plate for bonding said one surface of said device to said plate whereby said wires extend through said openings.

3. A semiconductor assembly comprising a semiconductor device having at least two connectors attached thereto, mounting means having at least two openings therein, said mounting means having a coefficient of thermal expansion substantially the same as that of said semiconductor device, and means for bonding said device to said mounting means whereby said connectors extend through said openings.

4. A semiconductor assembly comprising a semiconductor device having a plurality of connectors attached thereto, mounting means having a plurality of openings therein, said mounting means having a coefficient of thermal expansion substantially equal to that of semiconductor device, and means for bonding said device to said mounting means whereby said connectors extend through said openings.

References Cited in the file of this patent

UNITED STATES PATENTS

| | | |
|---|---|---|
| 2,813,326 | Liebowitz | Nov. 19, 1957 |
| 2,825,014 | Willemse | Feb. 25, 1958 |
| 2,836,878 | Shepard | June 3, 1958 |
| 2,862,160 | Ross | Nov. 25, 1958 |
| 2,866,140 | Jones et al. | Dec. 23, 1958 |
| 2,933,662 | Boyer et al. | Apr. 19, 1960 |